United States Patent [19]

Kurowski

[11] 4,377,626
[45] Mar. 22, 1983

[54] BREAKAWAY REGISTRATION PINS

[75] Inventor: Casimir J. Kurowski, Old Bridge, N.J.

[73] Assignee: Western Electric Co., Inc., New York, N.Y.

[21] Appl. No.: 289,933

[22] Filed: Aug. 4, 1981

[51] Int. Cl.³ .............................................. B32B 3/10
[52] U.S. Cl. ........................................ 430/5; 403/2; 403/220; 428/120; 428/67; 428/137; 428/426; 428/901
[58] Field of Search .................... 430/5; 428/119, 120, 428/81, 67, 137, 203, 204, 195, 209, 210, 901, 433, 457, 426; 427/98, 96; 29/829, 847; 339/17 A, 17 B, 17 T; 156/901; 64/78 R; 10/23; 403/2, 220; 285/3

[56] References Cited

U.S. PATENT DOCUMENTS

| 3,354,260 | 11/1967 | Brandt et al. | 174/68.5 |
| 3,388,931 | 6/1968 | Johnson et al. | 285/159 |
| 3,775,119 | 11/1973 | Bemis | 430/5 X |
| 4,094,111 | 6/1978 | Creegan | 403/220 X |

Primary Examiner—George F. Lesmes
Assistant Examiner—Alexander S. Thomas
Attorney, Agent, or Firm—W. O. Schellin; J. J. Jordan

[57] ABSTRACT

A breakaway registration pin (11, FIG. 2) comprises two sections, a first section (21) embedded in a glass art master (10) and a second section (22) bonded by a bonding agent to a top face (33) of the embedded first section (21). The bonding agent has a strength substantially less than the strength of the glass such that the registration pin (11) will break before the glass in art master (10) cracks when a force is applied to second section (22).

9 Claims, 4 Drawing Figures

BREAKAWAY REGISTRATION PINS

TECHNICAL FIELD

This application relates generally to registration pins for aligning articles and, more particularly, to a breakaway registration pin for aligning a printed wiring circuit substrate with a glass art master.

BACKGROUND OF THE INVENTION

During the manufacture of certain types of printed circuits, particularly electroless-plated printed circuits, an insulating surface of a substrate is first coated with a treating solution and then heated in an oven to form a thin solid film of coating on the substrate surface. Selected portions of the dired coating are then exposed to ultraviolet light through a glass art master, or mask, to delineate catalytic metal deposition sites at the exposed areas. The glass art master has located on one of its surfaces darkened land areas, or opaque sections, representing the outline of the circuit which is to be exposed onto the substrate by the ultra-violet light, and it is essential that each substrate be properly aligned with the surface of the glass art master to insure that the circuit is exactly placed on the substrate during exposure. To assure that the substrate is properly aligned, a typical glass art master has two steel registration pins located at diametrically opposite corners of the art master, with a lower portion of each pin embedded in the glass and an upper portion extending above the surface of the glass. Each printed circuit substrate has two registration holes located such that when the holes are placed over and fit onto the upper portions of the pins, the substrate is properly aligned on the glass art master.

Because the glass art master is typically made of heavy glass to allow for handling in a manufacturing environment and to prevent breaking, the weight of the glass and the substrate often combine to produce excessive shearing forces on the registration pins embedded in the glass thereby causing the glass around the lower sections of the embedded registration pins to crack. As can be realized, any cracking in the glass ruins the glass art master since the cracks will have the same effect as the opaque land areas and cause improper circuit configurations to be exposed onto a substrate during ultra-violet treatment. Furthermore, since the cracked glass can no longer firmly hold the registration pin in an exact position, the substrate positioned on the glass art master may not be properly aligned.

Therefore there is a need for a registration pin which will not crack the glass in a glass art master regardless of the forces applied to the pin.

SUMMARY OF THE INVENTION

The foregoing problem is solved by a breakaway registration pin for use in a hole in a surface of an article, for instance, a glass art master, wherein the pin comprises a first section adapted to be inserted into the hole for positioning in the hole so that a top face of the section is adjacent to the surface of the article and a second section adapted to be bonded to the top face of the first section with a bonding agent such that the bond between the first and second sections will break before the article, in which the first section is inserted, is damaged when a force is applied to the bonded second section.

Preferably, the first section of the pin is located in the glass art master with the top face of the pin flush with the surface of the art master to further prevent damaging of the top surface of the art master when the bond between the two sections of a registration pin breaks.

In a particular embodiment of the invention a collar is located in the hole such that it surrounds an upper portion of the first section which is embedded in the glass art master to further prevent cracking of the glass surrounding the first section.

After the old bond has been broken between the first and second sections, a new bond can be applied between the embedded first section and second section to form a new registration pin.

BRIEF DESCRIPTION OF THE DRAWINGS

Other features and advantages of the invention, its organization, construction, and operation will be best understood from the following detailed description of a specific embodiment thereof, taken in conjunction with the accompanying drawings in which.

DETAILED DESCRIPTION OF THE DRAWINGS

Figure 1:
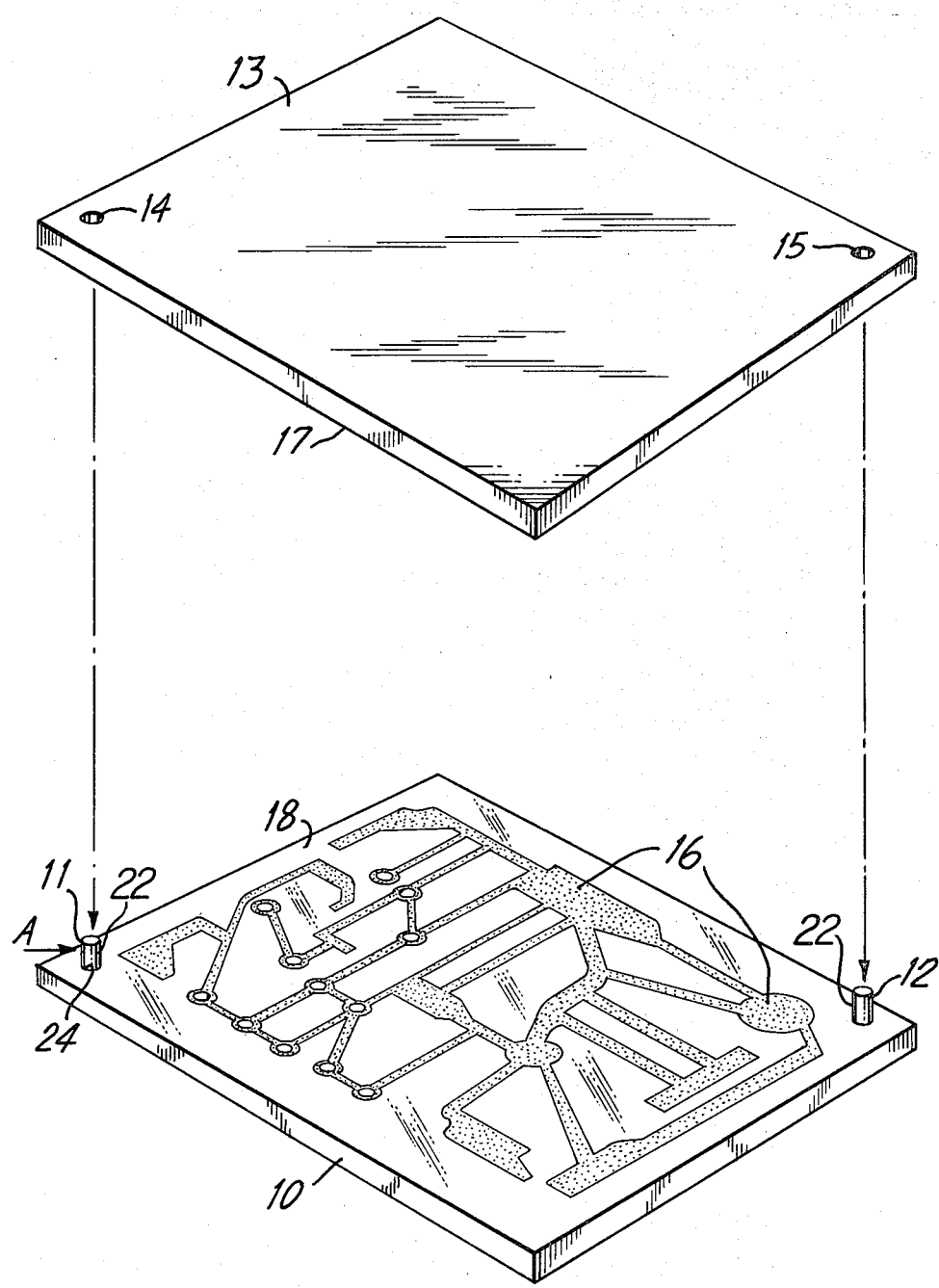
FIG. 1 is a perspective view of a glass art master having two registration pins, and a printed wiring board substrate having registration holes, with these elements aligned over each other but apart from each other for easier viewing.

Referring now to FIG. 1 there is shown a glass art master 10 having two registration pins 11 and 12 located at diagonally opposite corners of the art master. A printed wiring substrate 13, which has been already coated with a light sensitive coating, is aligned over master 10 with alignment, or registration pin, holes 14 and 15 in substrate 13 positioned over registration pins 11 and 12, respectively, as shown by the dotted lines.

Glass art master 10 has darkened circuit, or land, areas 16 representing the circuit configuration which is to be photographically placed onto the surface of substrate 13 by exposure to ultra-violet light during a subsequent manufacturing step. Circuit areas 16, which can be as thin as 0.025 mils (0.63 mm), are made of iron oxide which areas are placed on the glass by exposure to ultra-violet light in a process similar to the manufacture of the printed circuits explained herein.

In order to accurately transfer the circuit configuration outlined by circuit areas 16 from master 10 to exact locations on the bottom surface 17 of substrate 13, substrate 13 must be precisely aligned with glass art master 10. When the bottom surface 17 of substrate 13 rests on the top surface 18 of master 10 with registration pins 11 and 12 inserted into alignment holes 14 and 15, respectively, substrate 13 is accurately aligned with master 10.

Figure 2:
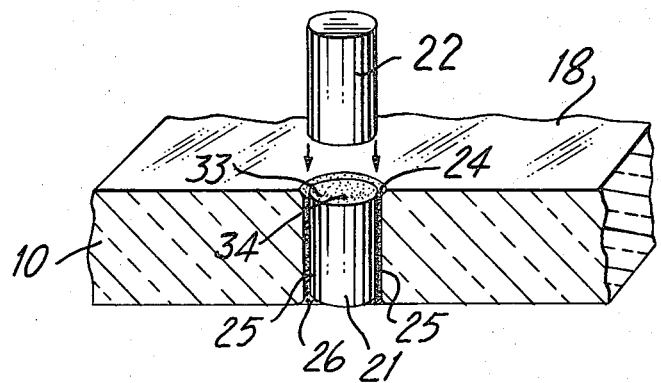
FIG. 2 is an enlarged view of a vertical section of the glass art master showing a registration pin located in the glass art master and with the two sections apart.

Registration pins 11 and 12, typically made of stainless steel, each comprise two sections, a lower, or first, section 21 and an upper, or second, section 22 as best seen in FIG. 2. Lower section 21 is cylindrical in shape and typically is as long as the glass art master 10 is thick, usually 120 mils (3.04 mm) and has a diameter of 126 mils (3.20 mm). Each lower section 21 is inserted into a hole 24 having a diameter of 144 mils (3.66 mm) which has been drilled in glass art master 10 at the precise position where the registration pin is to be located in art master 10. Before inserting lower section 21 into hole 24, the side walls 25 of lower section 21 are coated with an adhesive 26 to permanently cement lower section 21 to the walls of hole 24 after insertion into the hole.

Figure 3:
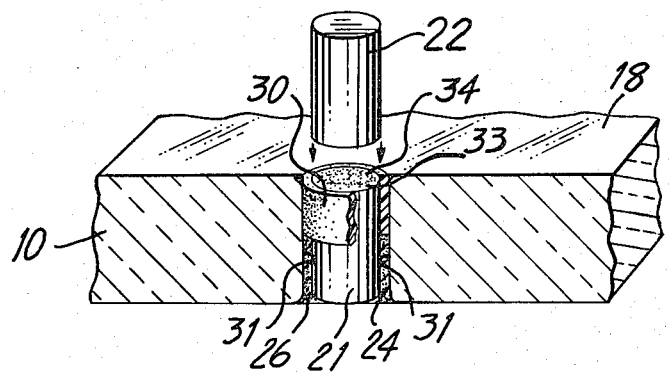
FIG. 3 is an enlarged view of a vertical section of the glass art master showing a registration pin with a collar embedded in the glass art master.
Figure 4:
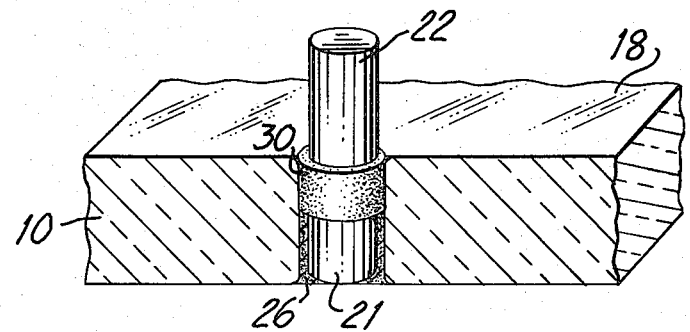
FIG. 4 is an enlarged view of a bonded registration pin embedded in the glass art master.

In a preferred embodiment, a collar 30, made from a heat shrinkable material, such as Teflon* synthetic resin polymer, is inserted into the top portion of the hole 24 adjacent to surface 18 of glass art master 10 as seen in FIGS. 3 and 4. Typically collar 30 has an outside diameter slightly less than that of hole 24, that is approximately 142 mils (3.60 mm), an inside diameter slightly larger than the diameter of pin 21, that is approximately 128 mils (3.21 mm), and is 60 mils (1.52 mm) long so that it extends halfway down into the hole 24. Lower section 21 of registration pin 11 is now inserted into the lower portion 31 of hole 24 and pushed up into collar 30 so that top surface, or face, 33 of section 21 is flush with surface 18 of glass art master 10 and the upper portion of section 21 is surrounded by collar 30 as seen in FIG. 3. Adhesive 26 is injected into the space between the lower portion of inserted section 21 and lower portion 31 of hole 24 to permanently bond section 21 in hole 24 as seen in FIGS. 3 and 4. An adhesive which may be used herein is manufactured by the 3M Company of St. Paul, Minn. and sold under the trade name Clear Auto Sealer.

*Trademark of E. I. du Pont de Nemours & Company

Collar 30 can be placed in hole 24 by initially placing a length of heat shrinkable tubing onto a drill rod having a diameter of 142 mils (3.60 mm), which is slightly smaller than the diameter of hole 24. After the tubing is heated to shrink it onto the rod, the shrunken tubing extending along the rod is trimmed to a length of 60 mils (1.52 mm) with the excess tubing removed from the rod. The drill rod, with the 60 mil length of tubing on it, is inserted into hole 24 and the drill rod is pulled through the hole from top to bottom leaving the 60 mil collar 30 "force-fitted" into and located in the top section of hole 24 as seen in FIG. 3.

In the configuration shown in FIG. 4, collar 30 acts as a bumper to prevent section 21 from chipping or cracking the glass adjacent to section 21 at upper surface 18 of art master 10.

After section 21 has been permanently cemented into hole 24 of glass art master 10, upper section 22 is affixed to section 21. As seen in FIG. 1, upper section 22 is cylindrical in shape but section 22 can be any shape required to fit into a correspondingly shaped alignment hole 14 in a substrate 13. For instance, if alignment hole 14 in substrate 13 is square shaped then upper section 22 would be square shaped. Since alignment holes 14 and 15 of FIG. 1 are round in shape, upper section 22 is shown as cylindrical.

Upper section 22 is typically made of stainless steel and is affixed to the top surface 33 of lower section 21 in the following manner. Lower section 21 has been permanently embedded in hole 24 to glass art master 10 with top surface 33 of section 21 flush with surface 17 of art master 10 as seen in FIGS. 2-4. A lock type bonding agent 34 comprising a single component anaerobic adhesive such as 312 Minute Bond manufactured by Loctite Corporation of Newington, Conn. is applied to top surface 33 as seen in FIG. 3 and upper section 22 is pushed in the direction of the arrows shown in FIG. 3 into contact with applied bonding agent 34 located on top surface 33 of embedded section 21 to form a breakaway pin 11 as seen in FIG. 4. To assure that both upper sections 22, seen in FIG. 1, are properly placed on lower sections 21, a template having holes which are precisely located so that they align over holes 24 in glass art master 10 can be placed on glass art master 10 in a manner similar to placing printed wiring substrate 13 over art master 10 as seen in FIG. 1. The template will securely hold upper sections 22 in place until bonding agent 34 cures and hardens thereby holding registration pins 11 and 12 in exact perpendicular alignment.

Glass art master 10 is typically made of soda lime glass, which glass will normally fail if a force exceeding 800 pounds is exerted on a registration pin rigidly embedded in glass art master 10 when the force is applied in a direction which is parallel with respect to surface 18 of master 10, for instance in the direction of arrow A of FIG. 1, and the force is applied at a point on the registration pin one inch (2.54 cm) above surface 18. Lock type bonding agent 34 can withstand a torque of 200 inch pounds; which strength is substantially less than the strength of the glass art master 10. Thus when upper section 21 is bonded to lower section 22 by means of lock type bonding agent 34 to form complete registration pin 11, a force of only 200 pounds applied to upper section 21 of registration pin 11 at a distance one inch (2.54 cm) from the bond in the direction of arrow A of FIG. 1 will break the bond formed by bonding agent 34 between the sections 21 and 22. Since the force necessary to break the bond is substantially less than the force required to crack glass art master 10, breakaway registration pins 11 and 12 will break before glass art master 10 will crack.

Since lower section 21 of registration pins 11 and 12 has been embedded in glass art master 10 with its top surface 33, where the bond with section 22 is formed, flush with top surface 18 of art master 10, upper section will break away from lower section 21 without contacting and scratching surface 18 when the bond is broken. If top surface 33 of embedded lower section 21 is positioned lower than top surface 18 of art master 10, upper section 22 could chip or damage the glass around the upper edge of hole 24 when the bond is broken and upper section 22 is forced away from lower section 21. Lower section 21 can be embedded in glass art master 10 such that top surface 33 is slightly higher, a few mils, than the top surface 18 of glass art master 10. However top surface 33 can not be so high as to extend into the lower end of alignment holes 14 and 15 in substrate 13. In that event, shearing forces exerted by substrate 13 onto pins 11 and 12 may not break the bond between sections 21 and 22 of each pin since the top portion of lower section 21, which juts into alignment holes 14 and 15, transmits a portion of the forces down lower section 21 into glass art master 10 and could damage the contacted glass thereby ruining the art master.

If sufficient force is exerted on upper section 22 to break the bond between sections 22 and 21, a new breakaway registration pin 11-12 can be reformed by bonding a new section 22 onto section 21. Since the top surface 33 of embedded section 21 is flush with top surface 18 of glass art master 10, section 22 did not chip or crack glass art master 10 when it became unbonded from section 21. Thus glass art master 10 is undamaged and a new section 22 can be bonded onto embedded section 21 by first cleaning the residue of the old bonding agent 34 from top surface 33 by wiping the surface with a solvent, such as 1,1,1,-trichloroethane, applying bonding agent 34 to clean surface 33, and then bringing section 22 into contact with the bonding agent 34 on surface 33 to form a new breakaway registration pin 11–12 as described above.

As an additional precaution against cracking the top surface 18 of glass art master 10 in the areas surrounding holes 24, collar 30 has been affixed to lower section 21 of each registration pin embedded in holes 24 as described above and shown in FIG. 4. Collar 30 acts as a buffer between stainless steel section 21 and the glass adjacent to the section to absorb any shocks which may be transmitted down registration pins 11 and 12 from objects coming into sharp contact with section 22 of pins 11 and 12. Collar 30 also acts to absorb the shocks and forces caused by day-to-day use of glass art master 10 with substrates 13 during manufacturing process to prevent wearing and chipping of the glass surrounding holes 24.

While specific examples and embodiments of the invention have been described in detail hereinabove, it should be obvious that various modifications may be made from the specific details, steps and methods described without departing from the spirit and scope of the invention.

What is claimed is:

1. A breakaway registration pin extending from a hole in a surface of an article wherein the pin comprises:
   a first section, having a cross-sectional area matching that of the hole but slightly undersized with respect thereto and a length no greater than the length of the hole, inserted into the hole and positioned within the hole so that a top face of the section is adjacent to the surface of the article; and
   a second section extending above the surface of the article and being bonded to the top face of the first section with a bonding agent having a bond strength between the first and second sections which is less than the strength of the material of the article such that the bond between the first and second sections will break before the article, in which the first section is inserted, is damaged when a force is applied to the bonded second section.

2. A breakaway registration pin as recited in claim 1 wherein the first section of the pin is positioned in the hole such that the top face of the first section is flush with the surface of the article.

3. A breakaway registration pin as recited in claim 1 wherein the bonding agent is single component anaerobic adhesive.

4. A breakaway registration pin as recited in any one of claims 1–3 further comprising a compressible collar located on an upper portion of the first section to act as a cushion between the first section and the article.

5. A breakaway registration pin as recited in claim 4 wherein the first and second sections are made of stainless steel.

6. A glass art master for use in placing images on a substrate and having a plurality of registration pins located in the glass for positioning the substrate on a surface of the art master, each of the registration pins comprising:
   a first section embedded in a hole in the glass art master with a top face of the section adjacent to the surface of the art master; and
   a second section, bonded to the top face of the first section with a bonding agent which forms a bond between the two sections such that when a force is applied to the second section the bond between the two sections will fail before the glass surrounding the hole in the art master is damaged.

7. A glass art master as recited in claim 6 wherein the first section is embedded in the hole with the top face flush with the surface of the glass art master.

8. A glass art master as recited in claim 6 wherein the top face of the first section of each registration pin retains a capacity to receive a third section to be bonded by a second bond to the embedded first section after the bond between the first and second sections fails, the second bond being capable of being formed with a bonding agent such that the second bond will fail before the glass in the art master cracks when a force is applied to the bonded third section.

9. A glass art master as recited in any one of claims 6–8 wherein each of the registration pins further comprises a collar of compressible material surrounding an upper portion of the embedded first section to act as a buffer between the first section and the glass art master.

* * * * *